United States Patent [19]

Bond et al.

[11] Patent Number: 4,911,644
[45] Date of Patent: Mar. 27, 1990

[54] ELECTRICAL CONNECTOR

[75] Inventors: Brian C. Bond; Thomas L. Smith, both of Essex, England; Ralph Altherr, Degersheim; Gerhard Schaad, Biberis, both of Switzerland

[73] Assignee: A. F. Bulgin & Company plc & Treff A.G., England, Switzerland

[21] Appl. No.: 276,237

[22] Filed: Nov. 25, 1988

[51] Int. Cl.⁴ ............................................. H05K 1/00
[52] U.S. Cl. ...................................... 439/67; 439/77; 439/493
[58] Field of Search ............................. 439/55, 59–62, 439/66, 67, 77, 91, 493, 498, 492

[56] References Cited

U.S. PATENT DOCUMENTS

| | | | |
|---|---|---|---|
| 3,230,498 | 1/1966 | Keys | 439/493 |
| 3,796,986 | 3/1974 | Tamburro | |
| 3,941,448 | 3/1976 | Evans | 439/493 |
| 4,227,767 | 10/1980 | Mouissie | 439/493 |
| 4,468,074 | 8/1984 | Gordon | |
| 4,597,617 | 7/1986 | Enochs | 439/66 |
| 4,647,125 | 3/1987 | Landi et al. | 439/67 |
| 4,691,972 | 9/1987 | Gordon | 439/493 |
| 4,768,971 | 9/1988 | Simpson | 439/67 |

FOREIGN PATENT DOCUMENTS

| | | |
|---|---|---|
| 269430 | 6/1988 | European Pat. Off. . |
| 570712 | 12/1975 | Fed. Rep. of Germany . |
| 1380281 | 1/1975 | United Kingdom . |
| 2163611 | 8/1985 | United Kingdom . |

Primary Examiner—David Pirlot
Attorney, Agent, or Firm—Oliff & Berridge

[57] ABSTRACT

A connection device for connecting the strip conductors of a flat tape-like cable to corresponding conductor tracks on a printed circuit board, includes one member backed by a member for engaging the cable across its width and formed with projections for engaging the individual conductors, and a second, corresponding member for engaging the reverse side of the board. Pressure is applied between the members to establish a pressure connection between the conductors of the cable and the respective conductor tracks by means of latches forming part of the backing member and engaging surfaces at the ends of a member fixed to the second member.

12 Claims, 4 Drawing Sheets

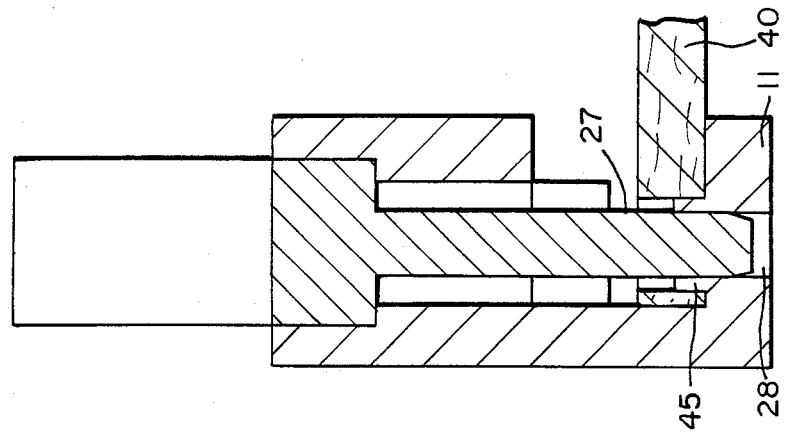
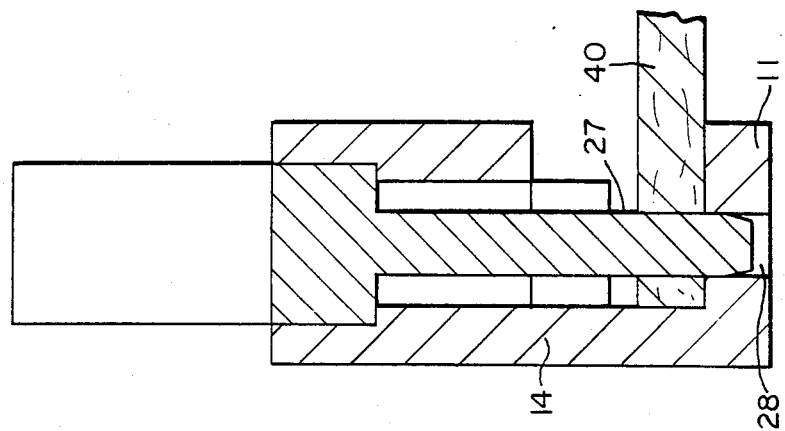
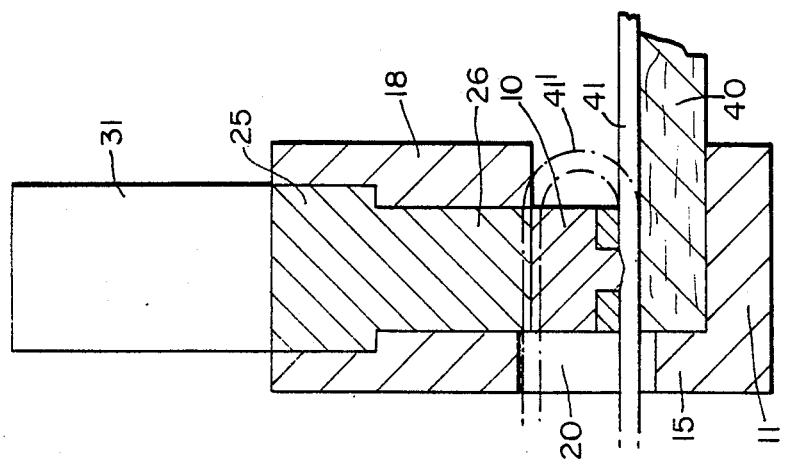

ELECTRICAL CONNECTOR

FIELD OF THE INVENTION

This invention relates to the electrical connection of the strip conductors of a flat, tape-like conductor cable to corresponding conductor tracks on a printed circuit board (abbreviated herein as "PCB").

BACKGROUND OF THE INVENTION

In the past, strip conductors of a flat, tape-like conductor cable have been connected to a PCB by arranging the cable on the underside of the PCB, that is to say the side remote from the conductor tracks, and making use of a connector having individual conductor members which project through corresponding openings in the PCB and which are soldered to the conductor tracks The making of connections in this way has been very time-consuming, largely due to the number of individual soldering operations involved.

More recently, therefore, the need for such soldering has been avoided by arranging the cable on the same side of the PCB as the conductor tracks and making the electrical connections between the strip conductors and the conductor tracks by direct mechanical pressure. Most commonly this has been achieved by means of an intermediate member having spaced conductors projecting from opposite sides, one end of each conductor member engaging a strip connector of the cable and the other end engaging a corresponding conductor track on the PCB.

In some cases, however, this intermediate member has been dispensed with and the strip conductors and conductor tracks have been pressed into direct contact with one another. This has involved the use of a clamping device, usually formed with spaced projections registering with the strip conductors so as to concentrate the pressure in the region of the individual connections and the pressure has been obtained by securing the clamping device to the PCB. Such a device thus includes a member for engaging the cable across its width and means for applying pressure to the member to establish a pressure connection between the conductors of the cable and the respective conductor tracks. Although this has proved relatively satisfactory, the fact that the reaction to the pressure exerted is inevitably carried by local areas of the PCB has led to risk of distortion of the latter.

SUMMARY OF THE INVENTION

According to the present invention, a connection device having the components just set out is characterized by a second corresponding member for engaging the reverse side of the PCB, the pressure applying means acting between the two members so as to spread the pressure across the width of the PCB. The fact that the reaction to the pressure is carried by a separate part in contact with the surface of the PCB means that the reaction can be spread relatively uniformly over the surface of this part and hence over the surface of the PCB engaged by the part, so the risks of distortion are substantially avoided.

DESCRIPTION OF THE INVENTION

The principle underlying the invention can be used either with a construction in which the strip conductors and conductor tracks are pressed into direct contact with one another, as just mentioned, or when an intermediate member is used between the strip conductors and the conductor tracks. If the strip conductors are pressed into direct contact with the conductor tracks, the part which engages the cable to exert the pressure is preferably formed with small projections registering with the strip conductors so as to concentrate the pressure in the region of these projections. An elastomeric pressure pad formed with openings through which the projections can extend to engage the cable can be fitted between the pressure member and the cable. Accordingly, when pressure is applied, the pad is compressed and the resultant relative movement between the two parts facilitates the use of mechanical latches to hold the two parts together and thus to maintain the pressure.

It is, of course, essential that the projections on the pressure member are in accurate register with the strip conductors of the cable and this is preferably achieved by means of locating members spaced apart by a distance greater than the width of the cable and which extend from the member engaging the cable or a backing member, so as to pass through corresponding holes in the PCB and co-operate with the second member.

In order to facilitate assembly, the second member, i.e. that intended to engage the PCB, may be rigidly connected to a further member with a space between the two for accommodating the assembly of cable and PCB, this further member being formed with an opening through which pressure is applied to the cable. With such a construction, a backing member for applying pressure to the member engaging the cable may be formed with latches for engaging corresponding surfaces on the further member just mentioned.

When the invention is applied to a construction including an intermediate member between the strip conductors and the conductor tracks, this intermediate member needs to have spaced conductors projecting from opposite sides, as described above and the means for applying pressure then includes a backing member acting on the cable to press it against the intermediate member and hence to press the latter against the PCB. The spaced conductors of the intermediate member are preferably conductive metal balls of diameter slightly greater than the thickness of the intermediate member which may be constituted by an insulating sheet with seatings for receiving the balls as a press fit. An elastomeric pressure pad may be included between the backing member and the cable and the backing member and the members for engaging the opposite side of the PCB may be held together by bolts.

DESCRIPTION OF THE DRAWINGS

Examples of constructions in accordance with the invention will now be described in more detail, by way of example, with reference to the accompanying drawings, in which:

FIG. 3 is a transverse sectional view on the line A—A in FIG. 2;

FIG. 4 is a similar transverse sectional view on the line B—B in FIG. 2;

FIG. 5 is a view corresponding to FIG. 4 of an alternative construction;

Figure 1:
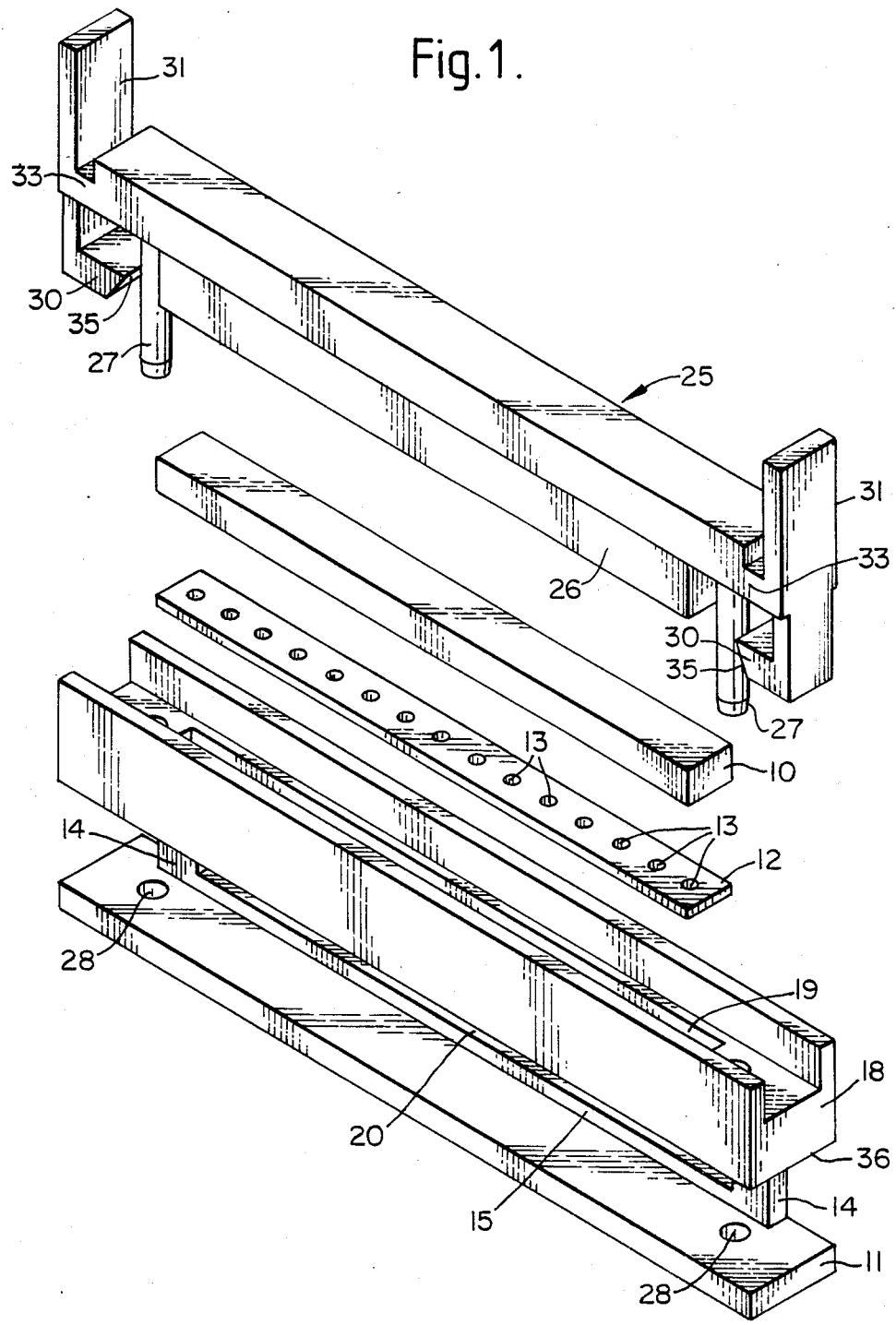
FIG. 1 is an exploded perspective view of the device without the cable and PCB in position.

Turning first to the exploded view of FIG. 1, the two most important parts are a pressure member 10 which engages the cable and has spaced projections (not seen in this view) for engagement with the individual strip conductors and a part 11 which is located on the opposite side of the assembly of cable and PCB and carries the reaction to the pressure applied to the assembly, spreading this reaction relatively evenly over the engaging surface of the PCB. In addition to these two basic components, there is a pressure pad 12 formed of elastomeric material such as Neoprene and formed with openings 13 for the passage of the projections on the underside of the part 10. The pad 12 is not essential and may either be omitted or alternatively be fitted above the member 10, in which case the openings 13 are not necessary. The part 11 is rigidly connected to a channel-shaped member 18, by struts 14 extending upwardly from shoulder 15 along the edge of the member 11. The channel-shaped member 18 is formed with a window 19 for the reception of the parts 10 and 12 to enable pressure to be applied to an assembly of cable and PCB, the former located in a space 20 between the shoulder 15 and the member 18 and the PCB being located against the shoulder 15 as best seen in FIG. 3.

A backing member 25 has a part 26 which engages the pressure member 10 and a pair of downwardly extending locating dowels 27 which, in the assembled position (as best seen in FIG. 4) fit into registering holes 28 in the part 11. The ends of the member 25 form mechanical latches each having a claw portion 30 and an operating arm 31. As shown, these arms extend vertically, but if it is desirable to reduce the overall height, they can extend horizontally. The member 25 is made of a resilient material such as nylon and each latch can thus turn about a relatively narrow neck portion 33 to allow the claws 30 to yield outwardly. Each claw has a chamfered face 35 and when the part 25 is pressed downwardly during assembly the chamfered faces 35 engage respective ends of the member 18, thus having a camming action forcing the claws 30 apart until the member 25 reaches a position in which the claws 30 can snap inwardly again to engage beneath respective surfaces 36 at the ends of the member 18.

Thus, in assembly, the cable is inserted through the space 20, juxtaposed with the PCB which engages the upper surface of the member 11 and abuts against the shoulder 15, and the pressure pad 1 and pressure member 10 are fitted into the window 19 in the part 18. The member 25 is then fitted into position, the part 26 also entering the window 19 to exert pressure on the member 10. The two locating dowels 27 also enter respective holes 28 having passed through corresponding holes in the PCB and as downward pressure is applied, the claws 30 are forced outwardly and then snap into position beneath the surfaces 36 as just described. In order to reverse the action, the operating arms 31 of the latches are pressed together thus moving the claws 30 outwardly and enabling the member 25 to be lifted clear.

Figure 2:
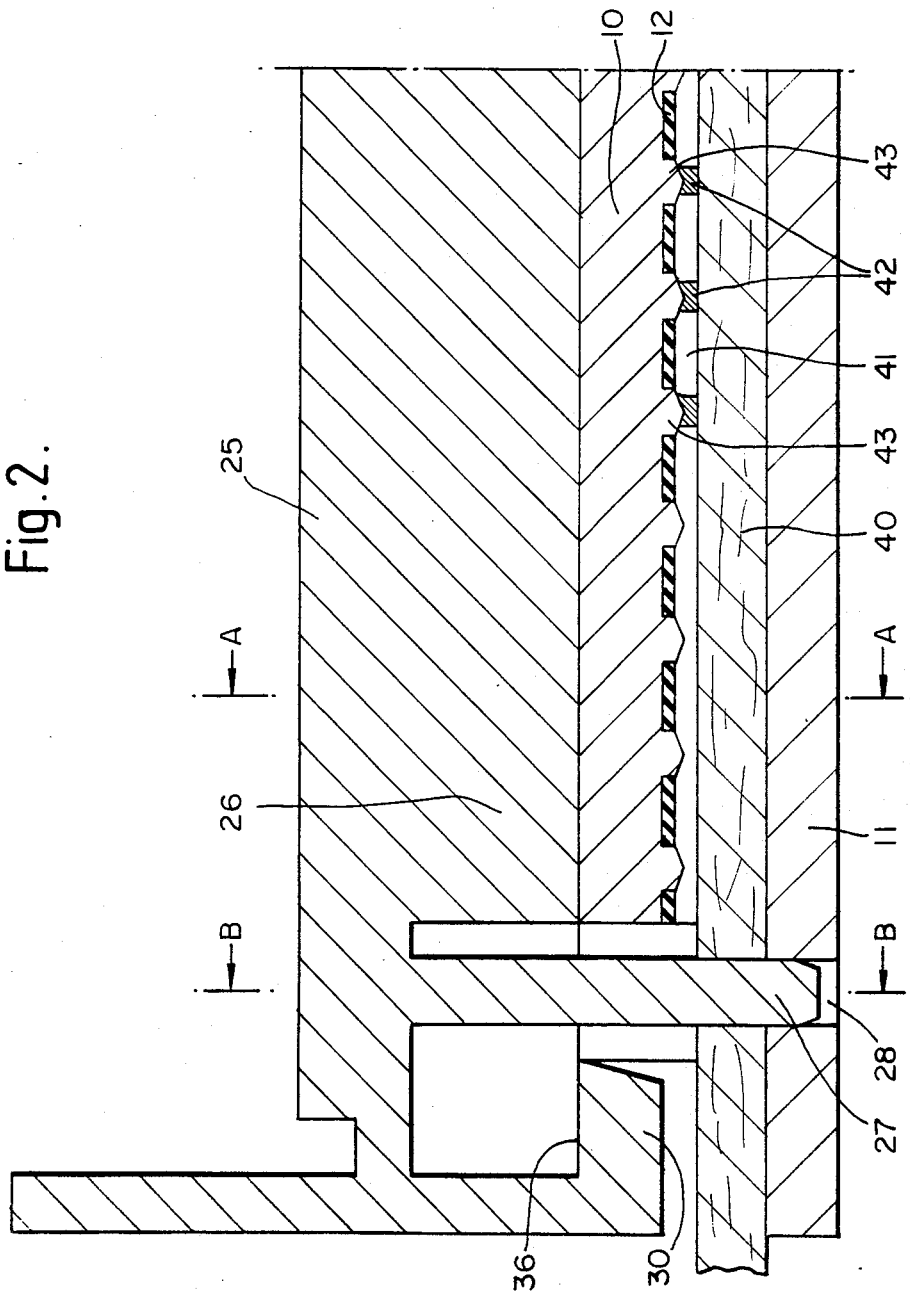
FIG. 2 is a longitudinal sectional view showing the parts in their assembled position so as to make a connection between a cable and PCB.

FIG. 2 shows the components in their assembled position with a PCB 40 engaging the upper surface of the member 11 and a tape-like cable 41 in the space 20 shown in FIG. 1. Some of the individual conductors of the tape are shown as 42 and it will be seen that each is directly engaged by a projection 43 on the part 10, these projections passing through the holes 13 in the pressure pad 12. One of the locating dowels 27 is seen in position in the respective locating hole 28 in the part 11 and it will be seen that the dowel also passes through a corresponding locating hole in the PCB 40. The dowel passes just outside the edge of the cable 41.

One of the claws 30 is seen in position in engagement with the surface 36 and locks the member 25 in position with the part 26 exerting pressure on the member 10. The pressure pad 12 is under compression and its resilience produces an upward force which holds the claws 30 firmly in engagement with the respective surfaces 36 and thus holds the complete assembly together with the conductors 42 of the cable pressed firmly against the corresponding conductor tracks of the PCB 40.

Further details of the assembly are seen from the sectional view of FIG. 3 which shows that the end of the PCB 40 abuts against the shoulder 15 on the part 11 while the cable 41 passes through the space 20. As seen in full lines, the cable 41 lies flat against the surface of the PCB 40 and is held solely by the clamping action resulting from the pressure applied by the member 10 backed by the member 25. For added security, the cable can be folded back on itself as shown in dotted lines at 41' and passed between the pressure member 10 and the part 26, as illustrated. This provides an added grip to the cable and avoids any risk of its becoming displaced.

FIG. 4 shows a further view of one of the locating dowels 27 passing through the PCB 40 and into the hole 28 in the part 11.

FIG. 5 is a view similar to FIG. 4, but showing a modification in which the part 11 is formed with an upwardly projecting rim 45 surrounding the entrance to the hole 28 and projecting upwardly into the hole in the PCB 40 which is enlarged for the purpose. In this way, the PCB 40 is located in relation to the part 11 quite independently of the dowel 27 which thus merely locates the part 25 in relation to the part 11.

Figure 6:
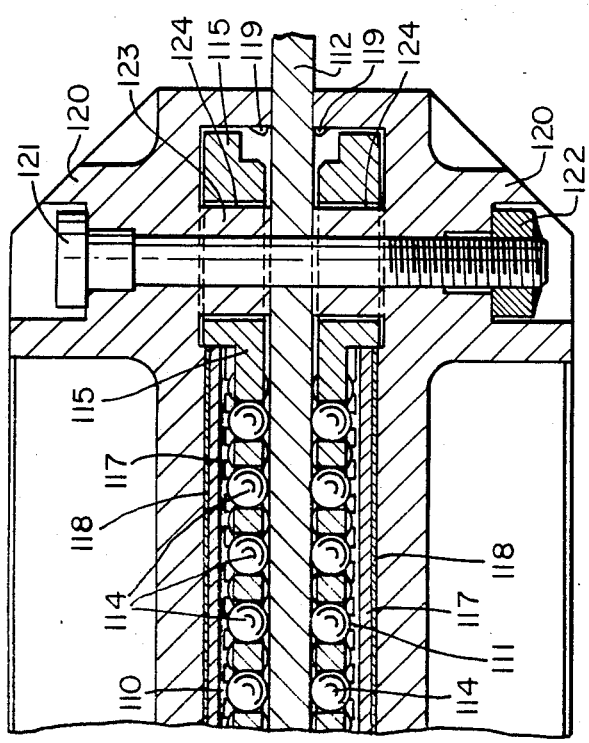
FIG. 6 is a sectional elevation of an alternative form of device used to press cable into contact with both sides of a double-sided PCB.

FIGS. 6 an 7 show an alternative form of the device using an intermediate member between the cable and the PCB, these Figures showing a double-sided arrangement for connecting cables on both sides of a double-sided PCB. Thus a pair of flat, tape-like conductor cables 110 and 111 are to be connected to corresponding conductor tracks on a double-sided PCB 112. The actual connections on each side of the PCB are made by conductive metal balls 114 which project on opposite sides of respective insulating intermediate members 115 located between the cable and the PCB on each side.

Each cable is backed by an elastomeric pressure pad 117 having an adhesive layer 118 and the assembly is completed by pressure members 120 formed with corresponding recesses for the reception of the members 115 and pressure pads 117. The entry of each recess is formed with small projections 119 which retain each member 115 in its recess. As seen in FIG. 6, the members 120 are held together by bolts 121 (only one of which is visible in FIG. 6) fitted with respective nuts 122 which exert pressure on the assembly as a whole. The bolts 121 pass through bosses 123 which extend through holes 124 in the members 115.

The pressure exerted causes the balls 114 to make firm electrical contact on one side with the strip conductors of the respective cables 110, 111 and on the other side with the conductor traces on the PCB. The assembly as a whole has the same main advantage as that described with reference to FIGS. 1 to 5, namely that the reaction to the pressure applied by the bolts 121 is spread relatively uniformly over the surface of the PCB so that the risks of distortion are largely avoided.

Intermediate members 115 and the associated balls 114 constitute self-contained units in which the balls are held captive. Each of the members 115 is molded from a slightly resilient plastics material and is formed with openings for the reception of the balls 114, which are slightly concave along their lengths to fit the balls with a slight clearance. After molding, the balls 114 are forced into the openings where they are trapped by the fact that the mouth of each opening has a diameter slightly less than that of the ball. In this position the balls project slightly at each side for contact with the strip conductors of the cable and the conductor tracks of the PCB.

Figure 7:
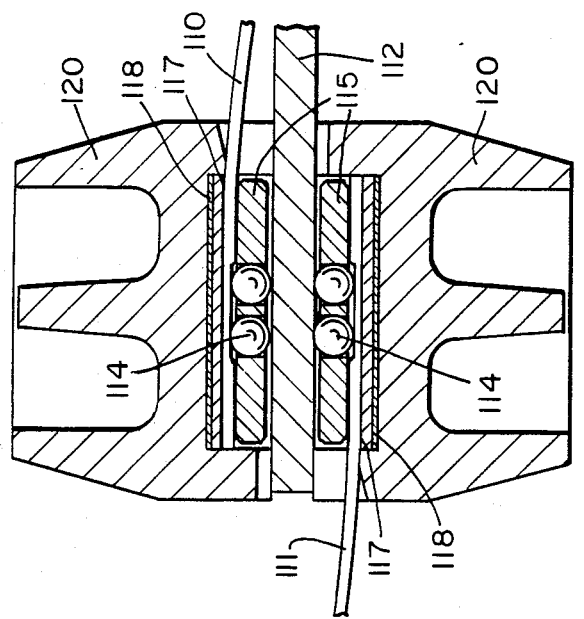
FIG. 7 is a sectional end view corresponding to FIG. 6.
Figure 9:
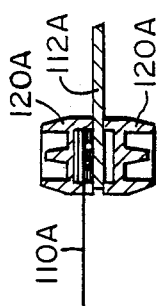
Figure 8:
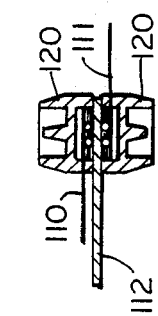

The arrangement illustrated in FIGS. 6 and 7 is intended for use with a double-sided PCB but can, of course, be equally well used with a single-sided board. FIG. 8 is a simplified view to a greatly reduced scale of the arrangement of FIGS. 6 and 7, showing all the components so far described. FIG. 9 is a similar view, but showing only a single-sided arrangement. Thus the cable 110A has its conductors connected to the conductor tracks of a single-sided PB 112A, the lower pressure member 120A serving only to carry the reaction to the pressure exerted by the other member 120A, but not itself serving to make any electrical connections.

Figure 10:
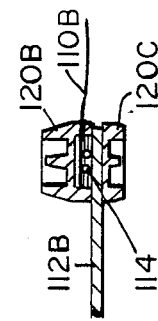
FIGS. 8, 9 and 10 are simplified views, to a greatly reduced scale, showing variations in the arrangement of the parts to be connected.

FIG. 10 shows a similar single-sided arrangement with a cable 110B connected to the upper side of a PCB 112B. An upper pressure member 120B is identical to the pressure members 120 and 120A shown in FIGS. 8 and 9 respectively, but the lower pressure member 120C is not recessed and thus bears against the underside of the PCB 112B across its whole width.

Various modifications of the illustrated forms of both alternative constructions are possible. For example, in the construction shown in FIGS. 1 to 5, the locating dowels 27 can be omitted altogether and the PCB located by small locating pegs projecting upwardly from the part 11. Although some form of latching for the member 25 is essential, this need not be by means of the claws illustrated and instead, latching projections may be formed on the ends of the part 18 engaging with openings in the lower parts of the arms 31. By inclining the outer surfaces of these projections, they can have a camming action forcing the arms outwardly until the projections snap into the openings. The latch is then released in the same way as already described, i.e. by pressing the operating arms 31 inwardly until the edges of the openings are clear of the projections.

In order to exert the necessary clamping action, the pressure member 10 must be pressed towards the part 11 on the lower side of the PCB and in the illustrated construction, since the part 11 is rigidly connected to the part 18, this result is obtained by means of the illustrated latching arrangement or the modification just described. However, it is not essential that the part 11 should be connected to the part 18 and if there is no such connection, the pressure ember must be latched directly to the member 11 instead of indirectly via the member 18. For example, the claws 30 may be extended downwardly so as to engage the underside of the part 11 instead of the part 36 as illustrated. The essential requirement is that the combination of the cable and the PCB should be sandwiched between a pair of clamping members which are latched together to hold the assembly firm.

Similar modifications are also possible in the alternative construction shown in FIGS. 6 and 7. For example, it is not essential that the conductors carried by the intermediate members 115 should be in the form of balls, but they may, for example, be formed by short rods with contact-making ends.

All these different forms of construction have the main advantage referred to originally, namely a relatively uniform distribution of pressure across the surface of the PCB, thus avoiding unnecessary distortion.

We claim:

1. A connection device for connecting strip conductors of a flat tape-like cable in face-to-face contact with respective conductor tracks on a first side of a printed circuit board, including a first member for engaging said cable across its width, a second corresponding member for engaging a side of said printed circuit board reverse of said first side, and means for applying pressure to said first member to establish a pressure connection between the conductors of said cable and said respective conductor tracks, the pressure applying means also acting between said first member and said second member so as to spread the pressure across the width of the printed circuit board, said first member being formed with projections registering with said strip conductors on a side of said cable opposite the side making said face-to-face contact, so as to concentrate the pressure in the region of said projections, said connection device further comprising an elastomeric pressure pad formed with openings through which said projections can extend to engage said cable.

2. A connection device according to claim 1, comprising locating members spaced apart by a distance greater than the width of the cable and extending from said first member engaging said cable or a backing member, so as to pass through corresponding holes in said printed circuit board and co-operate with said second member.

3. A connection device according to claim 1, wherein said second member is rigidly connected to, and spaced apart from, a further member, such that the space accommodates an assembly of said cable and printed circuit board, said further member being formed with an opening through which pressure is applied to said cable.

4. A connection device according to claim 3, comprising a backing member for applying pressure to said first member engaging said cable, said backing member being formed with latches for engaging corresponding surfaces on said further member.

5. A connection device for connecting strip conductors of a flat tape-like cable to respective conductor tracks on a first side of a printed circuit board, including a first member for engaging said cable across its width, a second corresponding member for engaging a side of said printed circuit board reverse of said first side, and means for applying pressure to said first member to establish a pressure connection between the conductors of said cable and said respective conductor tracks, the pressure applying means also acting between said first member and said second member so as to spread the pressure across the width of the printed circuit board, wherein said first member has spaced conductors projecting from opposite sides thereof with respective ends for engagement with said strip conductor of said cable and with a corresponding conductor track on said printed circuit board, and said means for applying pressure includes a backing member acting on said cable to press it against said first member and hence to press said first member against said printed circuit board, said spaced conductors of said first member comprising conductive metals balls of diameter slightly greater than the thickness of said first member.

6. A connection device according to claim 5, wherein said first member consists essentially of an insulating sheet with seatings for receiving said conductive metal balls as a press fit.

7. A connection device according to claim 5, comprising an elastomeric pressure pad between said backing member and said cable.

8. A connection device according to claim 5, wherein said backing member and said second member are held together by bolts.

9. A connection device for connecting respective strip conductors of first and second flat tape-like cables to conductor tracks on opposite sides of a double-sided printed circuit board, the device including first and second members for engaging said first and second cables, respectively, across their widths, and means whereby said first and second cables are pressed into electrical contact with said printed circuit board via said first and second members, wherein each of said first and second members has spaced conductors projecting from opposite sides thereof with respective ends for engagement with said respective strip conductors and with corresponding conductor tracks on said printed circuit board, said spaced conductors comprising metals balls of diameter slightly greater than the thickness of said first member and said second members, respectively.

10. A connection device according to claim 9, wherein said first member and said second member each consists essentially of an insulating sheet with seatings for receiving said conductive metal balls as a press fit.

11. A connection device according to claim 9, comprising elastomeric pressure pads respectively between said first member and said first cable, and between said second member and said second cable.

12. A connection device according to claim 9, wherein said first member and said second member are held together by bolts.

* * * * *